US006542455B1

(12) United States Patent
Kuwahara et al.

(10) Patent No.: US 6,542,455 B1
(45) Date of Patent: Apr. 1, 2003

(54) OPTICAL PROBE ARRAY HEAD DEVICE

(75) Inventors: Masashi Kuwahara, Tsukuba (JP); Takashi Nakano, Tsukuba (JP); Junji Tominaga, Tsukuba (JP); Nobufumi Atoda, Tsukuba (JP)

(73) Assignees: Agency of Industrial Science and Technology, Tokyo-To (JP); Masashi Kuwahara, Ibaraki-Ken (JP)

( * ) Notice: Subject to any disclaimer, the term of this patent is extended or adjusted under 35 U.S.C. 154(b) by 186 days.

(21) Appl. No.: 09/651,731

(22) Filed: Aug. 30, 2000

(30) Foreign Application Priority Data

Aug. 30, 1999 (JP) .......................................... 11-242783

(51) Int. Cl.[7] ................................................ G11B 7/00
(52) U.S. Cl. ...................................................... 369/126
(58) Field of Search ........................... 369/44.1, 112.24, 369/126

(56) References Cited

U.S. PATENT DOCUMENTS 5,199,090 A * 3/1993 Bell .............................. 369/126
6,185,178 B1 * 2/2001 Noh ............................. 369/126

OTHER PUBLICATIONS

K. Goto, Japanese Journal of Applied Physics, 37, pp. 2274–2278 (1998).
M. Kourogi et al., Technical Digest, International Symposium on Optical Memory (ISOM), Th–O–02, pp. 150–151 (1998).
K. Ito et al., Technical Digest, International Symposium on Optical Memory (ISOM) Th–O–04, pp. 154–155 (1998).
M.B. Lee et al., Applied Optics, 38(No. 16), pp. 3566–3571 (1999).

* cited by examiner

Primary Examiner—Nabil Hindl
(74) Attorney, Agent, or Firm—Wenderoth, Lind & Ponack, L.L.P.

(57) ABSTRACT

Provided is an optical probe array head device in which a single optical detector or a plurality of optical detectors are disposed to each of the optical probes constituting an optical probe array having a plurality of apertures. The optical detectors are arranged to surround the aperture so as to be able to efficiently detect scattering of a feeble near-field light enabling similtaneous detection of a multipilicity of optical signals. In this device, an optical lens system necessary for optical detection can be omitted by integrating the optical probe array and the optical detectors. In addition, the output signals from the optical detectors can be utilized for conducting position control of the optical probe array head.

4 Claims, 5 Drawing Sheets

OPTICAL PROBE ARRAY HEAD DEVICE

BACKGROUND OF THE INVENTION

The present invention relates to an optical probe array head device utilized for information recording and reproduction in optical disks and the like.

With an object to further increase the density of optical recording, in recent years, intensive investigations are now under way for conducting near-field optical recording by employing a scanning near-field optical microscope (SNOM). Among them, the method for conducting optical recording by employing an optical probe array prepared by the technology of fine working on a silicon semiconductor is highlighted as a technology which is remedial for the low data transfer velocity as a defect in the recording method using a SNOM.

However, the optical probe arrays of the prior art have such a constitution that the silicon substrate is provided thereon with only a near-field light generating part or, namely, an aperture and the means for optical detection utilizes, as in the prior art, detection of signals by conducting the light condensed by the use of an optical lens system toward a semiconductor optical detector. Since optical lenses are used for both of optical detection and light introduction in this way, a space for containing a built-in lens system or a mechanism for focusing is indispensable so that the device for optical recording is necessarily large and elaborate.

While it is unavoidable that, as the recording density is increased, the recording marks become minute and the intensity of the optical signals consequently becomes feeble, the light-condensing solid angle in the prior art technology is so small due to the use of an optical lens system that the proportion of detectable optical signals is at best only about one tenth of the overall optical signals.

In addition thereto, a position controlling technology such as a tracking control means for accurately tracing the sequence of optical marks, a means for holding the optical probe array always in parallel to the recording medium and so on must be provided but current optical probe arrays are not suitable for such position control.

While a circuit for processing the signals used for the control in various ways must be provided, such a circuit is provided in the prior art separately from the optical probe array so that the device is necessarily large and elaborate and also expensive.

Despite the high data transfer velocity possessed by the optical probe array, as is described above, the optical recording instrument is large and elaborate due to the use of a conventional optical lens system. Further, the light-condensing solid angle is only about 1 sr at best. This value of the light-condensing solid angle means that, as compared with the overall light-condensing solid angle which is $4\pi$ sr, the proportion of detectable optical signals is only about one tenth of the overall signals so that the emitted optical signals are mostly unutilized.

The technology for position control of optical probe array head such as tracking to accurately trace the sequence of recording marks and the like has not yet been fully established. The fact that the signal processing system is provided separately from the optical probe array is the reason for the device as a whole rendered large and elaborate with expensiveness.

In short, a high data transfer velocity can hardly be accomplished in the prior art recording using the near-field light due to the use of a SNOM. While a high transfer velocity could be expected in an optical probe array with improvements of these defects, following problems must be solved for the practical application thereof.

1) The device is large and elaborate as a consequence of the use of an optical lens system, which is the prior art technology, in the optical detecting part or light-introducing part.
2) While the recording marks are rendered more and more minute as the recording density is increased, the feeble optical signals therefrom cannot be detected with a high efficiency due to the use of an optical lens system.
3) Position control of the optical probe array, such as the tracking technology and so on, cannot be fully undertaken in the prior art technologies.
4) The optical probe array head device is large and elaborate with expensiveness because the optical signal processing circuit is provided externally.

SUMMARY OF THE INVENTION

The present invention has an object, in order to solve these problems, to provide an optical probe array head device with omission of the optical lens system necessitated for optical detection.

Another object of the present invention is to provide an optical probe array head device enabling position control such as tracking and the like to accurately trace the sequence of recording marks.

The present invention is to provide an optical probe array head device which is simple and of low costs.

Namely, the present invention provides an optical probe array head device in which the optical lens system indispensable in the prior art technology for optical detection is omitted by providing the optical probe array with an optical detecting part and which enables position control such as tracking and the like to accurately trace the sequence of recording marks by dividing the optical detecting part into a plurality.

In order to solve the above mentioned problems, the present invention provides an optical probe array head device capable of simultaneously detecting a multiplicity of signals coming from a sample or a recording medium by disposing a plurality of apertures which serve as optical probes in an array and by disposing one or a plurality of optical detectors in each of the apertures.

The above mentioned optical detectors provided in the optical probe array are characterized in that they are integrated with the probe array by the fine working technology.

The optical detectors, which are arranged to surround the above mentioned apertures, can detect scattering of feeble near-field light with a high efficiency.

The constitution is such that tracking control is performed by conducting signal processing utilizing the output signals from a plurality of divided detectors obtained by dividing a single optical detector into a plurality.

It is optional that the above described optical probe array is provided with a necessary circuit for processing of signals by utilizing the technology of fine working.

DETAILED DESCRIPTION OF THE PREFERRED EMBODIMENTS

In the following, a detailed description is given on the practicing mode of the optical probe array head device according to the present invention by making reference to the accompanying drawing.

EXAMPLE 1.

Figure 1:
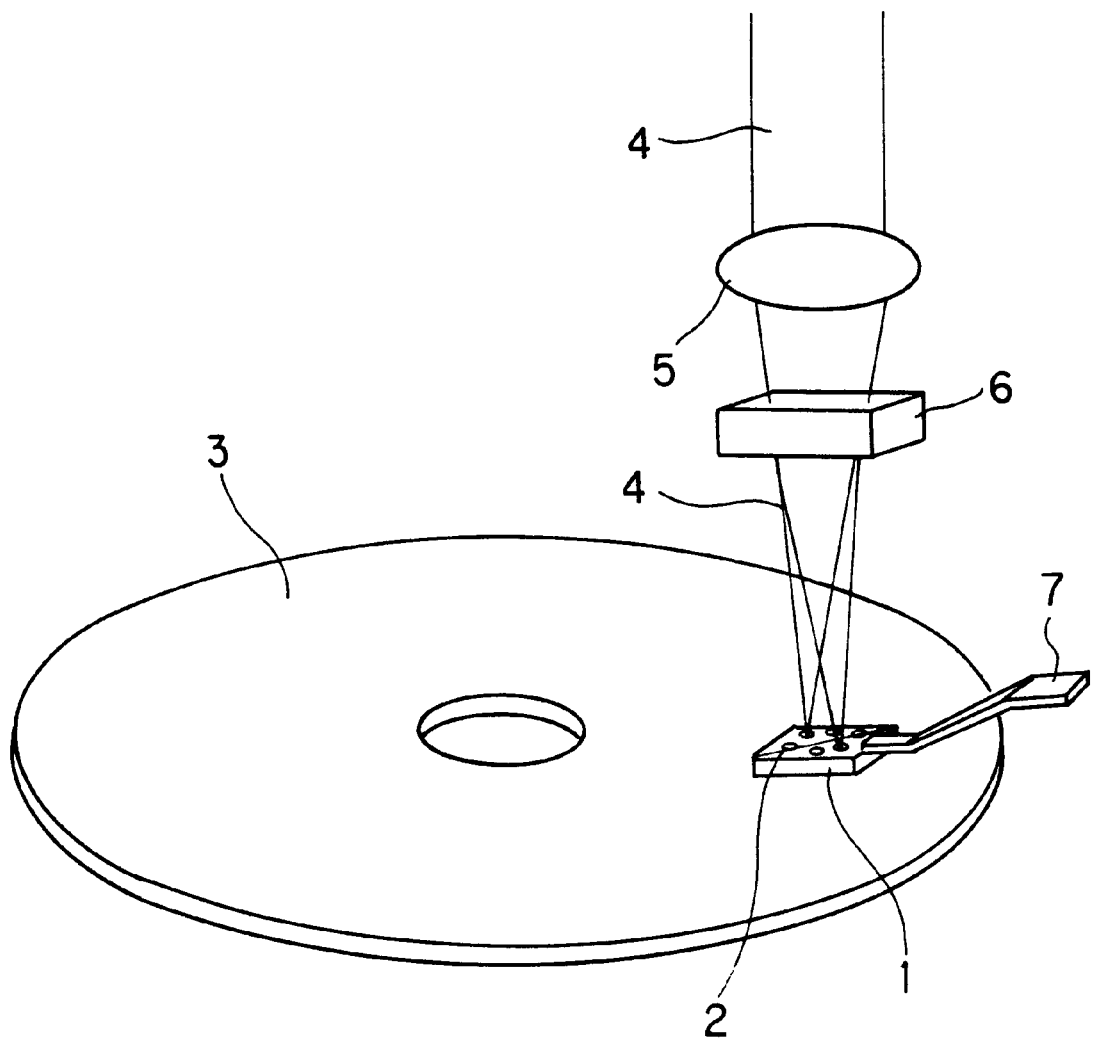
FIG. 1 is a schematic explanatory illustration showing an example of the optical recording system by utilizing the optical probe array head device of the optical detector-integral type according to the present invention.

FIG. 1 illustrates an example of the inventive optical probe array head device of the optical detector-integral type with arrangement of a recording medium.

As is understood from this figure, the inventive optical probe array head device 1 of the optical detector-integral type is positioned above the recording medium 3 as being supported by a supporting member 7 and the optical detector is provided on the surface of the optical probe array head of the optical detector-integral type facing the recording medium. The laser beam 4 incident on the optical probe array head of the optical detector-integral type passes the lens 5 and is guided by the space modulator 6 to enter each of the apertures 2,2, . . . where a near-field light is generated.

Figure 2A:
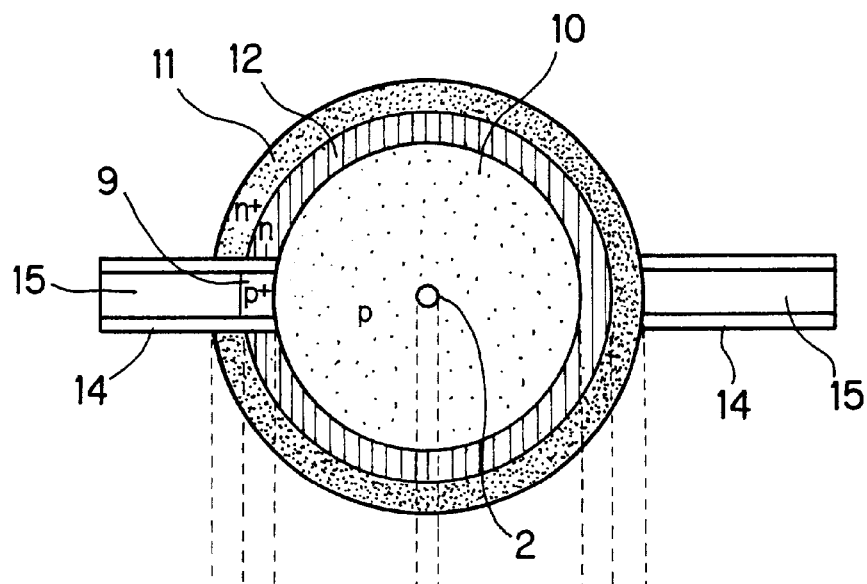
FIG. 2A and FIG. 2B are a bottom view and a schematic vertical cross sectional view, respectively, of the optical detector in the optical probe array head of the optical detector-integral type according to the present invention.
Figure 2B:
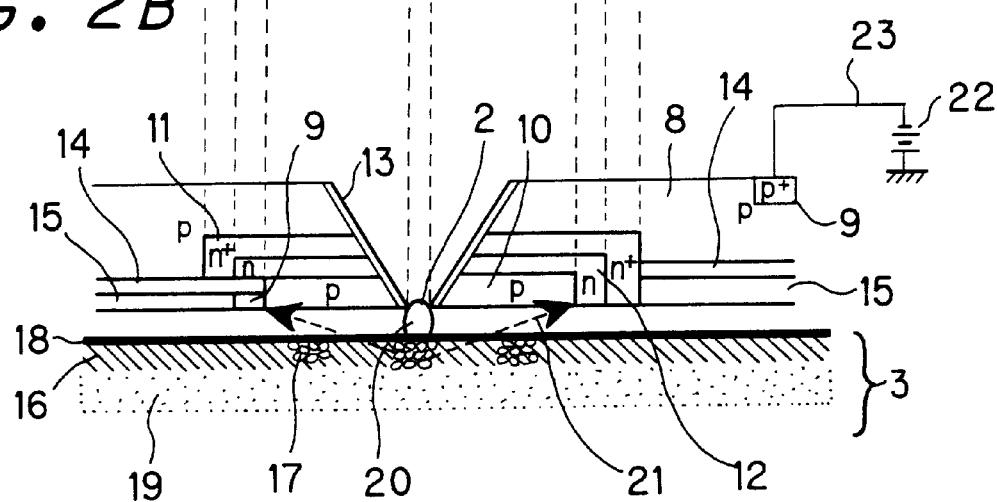

FIGS. 2A and 2B are a bottom view and a schematic cross sectional view, respectively, of one of the apertures in the optical probe array head devices of the optical detector-integral type in FIG. 1. FIG. 2B also shows a recording medium 3 for explanation.

Here is shown an optical detector by utilizing a pn junction. The near-field light 20 generated at the aperture 2 is scattered by the recording marks 17 in the recording layer 16 provided on the substrate 19 of the recording medium 3 and the scattered light 21 enters the optical detector. The optical signals are converted to electric signals at the pn junction formed from a low-doping p-type semiconductor 10 and a low-doping n-type semiconductor 12 and provided on the bottom surface of the optical probe array head. The electric signals are taken out to the outside through the circuit wiring part 15 surrounded by the electric insulator 14 and further embedded within the optical probe array head. In FIG. 2A, the part disposed to encircle the apertures as a whole constitutes a single optical detector.

The optical probe array head device 1 of the optical detector-integral type and the recording medium 3 are closely positioned by keeping a nanometer-order gap or, alternatively, are in contact each with the other with intervention of a protective lubricant film 18. Accordingly, the scattered light 21 from the recording marks 17 can be taken into the optical detector with a light-condensing solid angle of about $2\pi$ when the size of the optical detector is made sufficiently large as compared with the aperture so that the signal intensity is increased. And, while the depth of the pn junction should be selected by taking into consideration the wavelength of the light employed or the kind of the semiconductor, the permeation depth of light is a few micrometers when the light is in the visible range and the semiconductor is silicon so that a high efficiency as an optical detector can be obtained with a pn junction of around this depth.

Further, when the pn junction is surrounded by a high-doping p-type semiconductor 9 or a high-doping n-type semiconductor 11:

1) an ohmic contact can be formed between the semiconductor and the circuit wiring part 15;
2) the light incident from outside or, in particular, from above and transmitting the semiconductor substrate 8 can be blocked there so as to decrease the noise generated at the pn junction by the transmitting light; and
3) the scattered light transmitting the pn junction is again reflected there and again led to the pn junction so that the signal intensity can be increased.

The light-shielding film 13 is provided in order to prevent transmission of the light coming from the upper part of the optical probe array head device of the optical detector-integral type to enter the pn-junction optical detector. However, a variety of constitutions are possible for the pn junctions beside the constitution of the pn junction described here. While an electric voltage is applied to the semiconductor substrate 8, a negative voltage is applied in the case of a p-type semiconductor substrate. The figure shows a voltage source 22 and a circuit wiring 23.

A transistor of the pnp structure is formed with the other optical detectors so that the carriers generated in the optical detector enter the other optical detectors to cause a noise. An electric voltage is applied in order to prevent this phenomenon so as to prevent the carriers from entering the other optical detectors. Incidentally, the electric voltage is applied here to the substrate by means of a circuit wiring taking ohmic contact through the high-doping semiconductor.

Figure 3:
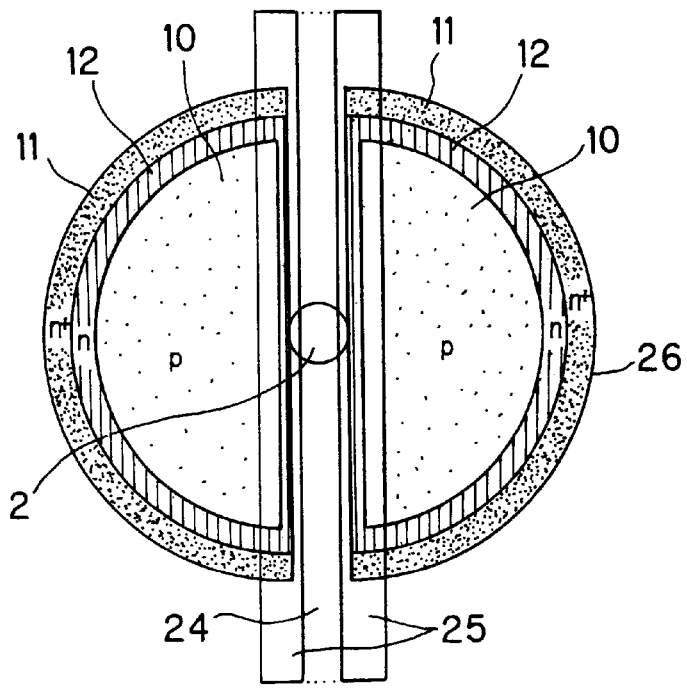
FIG. 3 is a plan view of the optical probe array head of the two-fold divided optical detector-integral type according to the present invention.
Figures 4A, 4B, 4C:
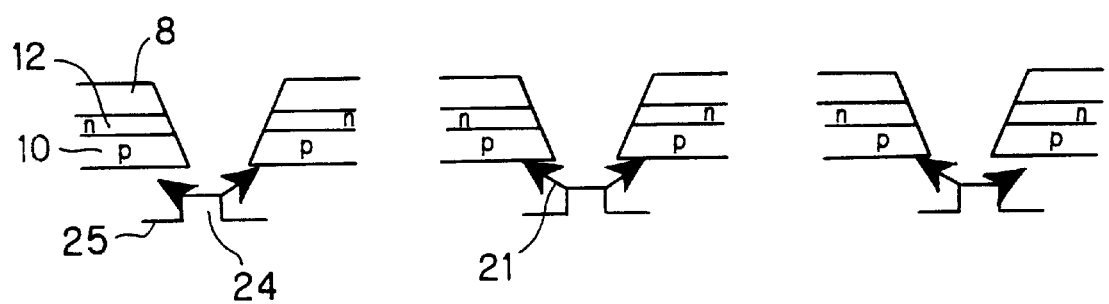
FIGS. 4A, 4B and 4C are each an explanatory illustration showing the relationship between the light scattering intensity and the tracking displacement of the optical probe array head of the optical detector-integral type.

FIG. 3 is a plan view of an optical probe array head device 26 of the optical detector-integral type in which the optical detector is divided two-fold and FIGS. 4A, 4B and 4C are each an illustration for explaining the tracking-control ways by utilizing the same. The recording marks are recorded on the land 24 and the land is tracked. The circuit wiring part is the same as in FIG. 2A so that it is omitted here. The figure shows grooves 25.

FIGS. 4A, 4B and 4C each show the relationship between tracking displacement and the light scattering intensity.

FIG. 4A is for showing the case where the optical probe array head device of the optical detector-integral type is displaced rightwardly relative to the land 24. Since the near-field light is scattered more intensely by the corner portions of the land 24, a more intense scattered light 21 enters the right side optical detector resulting in intensification of the output signals from the right side optical detector. FIG. 4B is for the case without displacement relative to the land 24 and, since the scattered lights 21 incident on the right and left optical detectors have equal intensities, the output signals therefrom are identical. FIG. 4C is for a leftward displacement relative to the land 24 and, inversely to the rightward displacement, the output signals from the left side optical detector are intensified.

It comes out from the above that the displacement of the aperture relative to the land can be detected by taking the differential signals between the output signals from the right and left optical detectors. Position setting of the optical probe array head of the optical detector-integral type can be conducted on the base of these signals. It is also possible to conduct discrimination of the scattered light from the recording marks by means of the sum signals of the output signals from the right and left optical detectors.

EXAMPLE 2.

While Example 1 describes on a two-fold divided optical detector in the optical probe array head, four-fold dividing is described here. While it is essential that the optical probe array head is held always in parallel to the recording medium, position control cannot be performed with a two-fold divided optical detector. Accordingly, a description is given of the method for conducting position control thereof by four-fold dividing of the optical detector.

Figure 5:
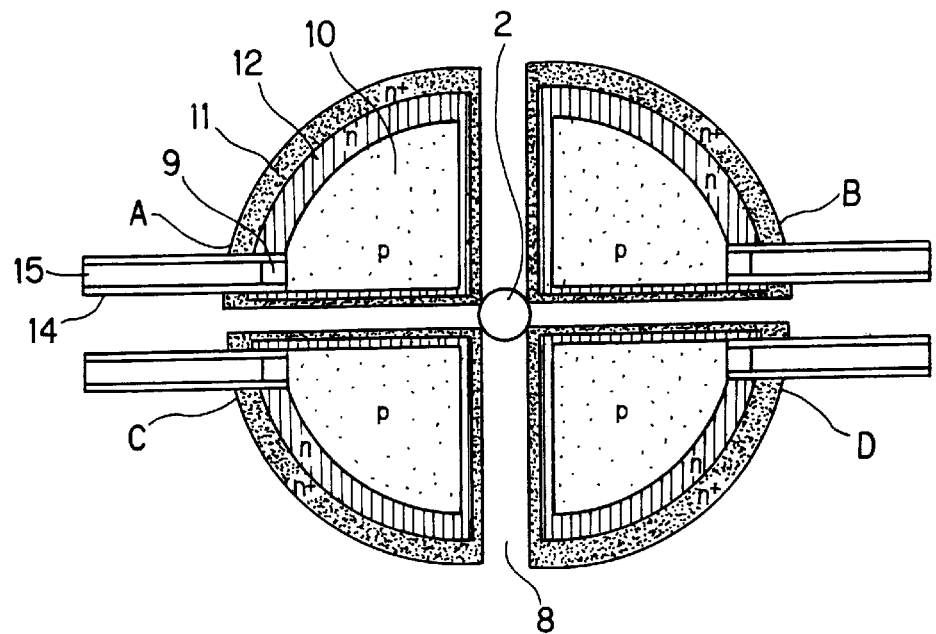
FIG. 5 is a bottom view of the four-fold divided sector type optical detector of the present invention.

FIG. 5 is a bottom view of the four-fold divided optical detector of the optical probe array head of the optical detector-integral type. When the recording medium is inclined relative to the optical probe array head, a difference is produced between the sum signals of the signals from the optical detectors A and B and the sum signals of the signals from C and D. This is because, since a difference is produced by the inclination between the distances from the recording medium to the optical detectors A and B and the optical detectors C and D of the optical probe array head of the optical detector-integral type, the intensity of the entering scattered light is higher in the optical detectors nearer to the recording medium.

By taking the difference between these two sum signals, position control of the optical probe array head is conducted by means of this signal. Since the sum signals of the signals from A and C and from B and D are each the same as the signals described in Example 1, control of tracking can be conducted by utilizing the same.

EXAMPLE 3.

Figure 6:
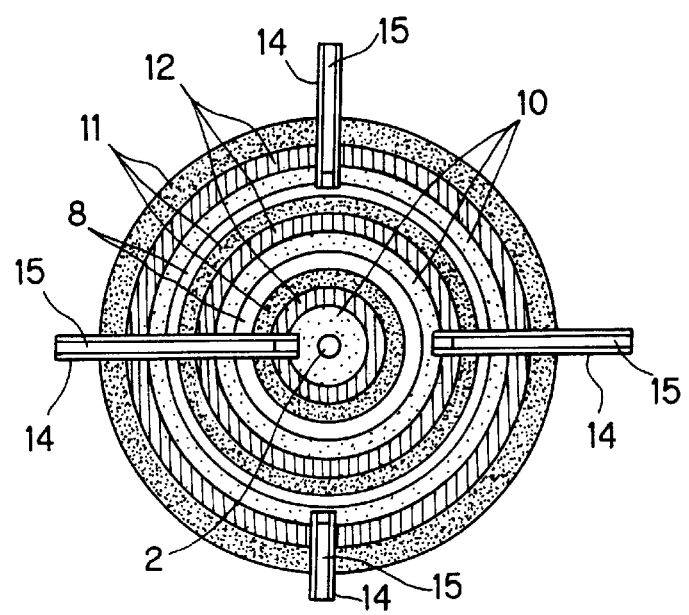
FIG. 6 is a bottom view of the optical detector divided along the circumferential direction.

A description is given of a different method for dividing the optical detector in an optical probe array head as well as on the position control and tracking control by using the same. FIG. 6 is a bottom view of the optical detector of an optical probe array head of the optical detector-integral type where the optical detector is divided along the circumferential direction of circle.

Following advantages are obtained by dividing the optical detector in this way. A noise for the direct-current component is outputted by direct entering of the near-field light into the optical detector close to the aperture 2.

Since the noise level depends on the kind of the recording medium, or on the profile of the aperture in the optical probe array head of the optical detector-integral type and so on, it is unclear how large the distance from the aperture should be for sufficiently decreasing the noise. Accordingly, it is the way to be undertaken that the optical detector is divided along the circumferential direction into ring-formed portions and the optical detector at the position remote from the aperture where the noise level is sufficiently low is employed.

EXAMPLE 4.

Figure 7:
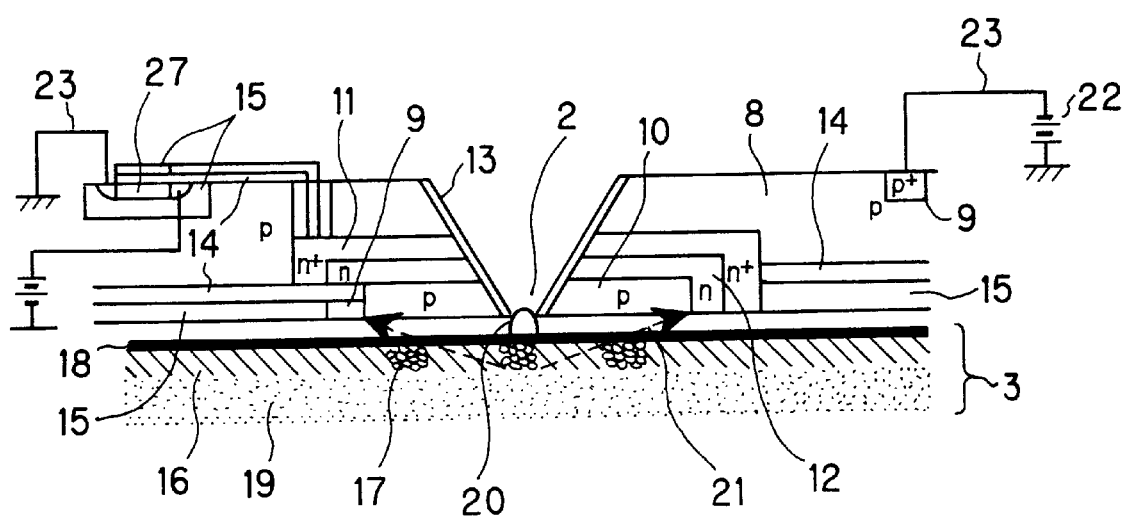
FIG. 7 is a schematic cross sectional view of the optical probe array head of the optical detector-integral type having a built-in signal processing circuit.

FIG. 7 is a schematic cross sectional view of an optical probe array head provided with a signal processing circuit 27. In this example, the signal processing circuit is a CMOS circuit. This circuit can be constructed by utilizing the process well known in the semiconductor technology. Since the signal processing system can be prepared on the optical probe array simultaneously with preparation of the apertures, it is not necessary to externally provide the circuit so that a simple and inexpensive device is obtained.

In the above, the optical probe head of the present invention is described by way of examples but the present invention is never limited by the above given examples including, needless to say, a variety of modes for practicing.

For example, although it is the simplest and most convenient to have the optical detector in the form of a pn junction, the optical detector can be a charge-coupling device (CCD) and the like. Further, an optical detector of a pn junction with exchange of the p-type and n-type in the pn junction shown in FIG. 2B can be used without any problems. While, in connection with position control of the optical probe array head of the optical detector-integral type, examples were given by directing attention to the optical detector provided for a single aperture, a possibility is obtained for the position control by conducting signal processing for the sum signals and/or differential signals with the output signals coming from the optical detectors provided in the other apertures.

As to the ways of dividing optical detectors, dividing as a combination of the dividing types in Example 1 and Example 3 is also possible and it is also possible to conduct position control finely by dividing into a larger number. While an example was given for the use of an optical waveguide for the introduction of light, furthermore, a light emitter such as a semiconductor laser and the like can also be provided in the upper part of the apertures. While the circuit wiring part was embedded in the bottom surface of the optical probe array head, it is also possible to provide a through-hole from the upper surface of the optical probe array head to the pn junction and to accomplish the circuit wiring in the upper part by using the same as the circuit wiring part.

According to the present invention, an optical lens system necessitated for optical detection can be omitted by integrating the optical probe array and the optical detector and, further, position control such as tracking control to accurately trace the sequence of recording marks and so on is made possible by dividing the optical detector into a plurality so that the efficiency for optical signal detection can be increased.

When a signal processing circuit is provided on the optical probe array unneccesitating any external circuits, a simple and inexpensive optical probe array head device can be provided.

What is claimed is:

1. An optical probe array head device for simultaneously detecting a plurality of optical signals, in which a single optical detector or a plurality of divided optical detectors are disposed to each optical probe of an optical probe array constituted of a plurality of optical probes each having a single aperture and wherein the single optical detector or a plurality of the optical detectors are disposed in such a fashion as to surround the aperture.

2. The optical probe array head device as described in claim 1 in which the optical detector provided to each of the optical probes is integrated with the optical probe array.

3. The optical probe array head device as described in claim 1 in which a plurality of the optical detectors are formed by dividing a single optical detector into a plurality and are connected to a tracking-control signal-processing device for processing of the output signals from a plurality of the optical detectors.

4. The optical probe array head device as described in claim 1 in which the optical probe array is provided with a circuit for processing of the tracking-control signals.

* * * * *